(12) United States Patent
Bhattacharya et al.

(10) Patent No.: US 8,089,739 B2
(45) Date of Patent: Jan. 3, 2012

(54) ELECTROSTATIC DISCHARGE PROTECTION CIRCUIT

(75) Inventors: Dipankar Bhattacharya, Macungie, PA (US); Makeshwar Kothandaraman, Whitehall, PA (US); John C. Kriz, Palmerton, PA (US); Bernard L. Morris, Emmaus, PA (US); Yehuda Smooha, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 12/438,460

(22) PCT Filed: Oct. 30, 2007

(86) PCT No.: PCT/US2007/082934
§ 371 (c)(1),
(2), (4) Date: Feb. 23, 2009

(87) PCT Pub. No.: WO2009/058128
PCT Pub. Date: May 7, 2009

(65) Prior Publication Data
US 2010/0232078 A1 Sep. 16, 2010

(51) Int. Cl.
*H02H 3/22* (2006.01)
*H02H 3/20* (2006.01)
*H02H 9/04* (2006.01)
(52) U.S. Cl. ......... 361/56; 361/111; 361/91.1; 361/91.5
(58) Field of Classification Search ...................... 361/56, 361/111, 91.1, 91.5
See application file for complete search history.

(56) References Cited

U.S. PATENT DOCUMENTS

| | | | |
|---|---|---|---|
| 5,524,096 A * | 6/1996 | Roohparvar | 365/194 |
| 5,946,177 A | 8/1999 | Miller et al. | |
| 6,118,640 A * | 9/2000 | Kwong | 361/56 |
| 6,455,902 B1 * | 9/2002 | Voldman | 257/378 |
| 7,072,161 B2 * | 7/2006 | Chen | 361/91.1 |
| 7,221,551 B2 | 5/2007 | Chen | |
| 7,423,855 B2 * | 9/2008 | Fankhauser et al. | 361/56 |
| 7,518,845 B2 * | 4/2009 | Gauthier et al. | 361/56 |
| 7,593,202 B2 * | 9/2009 | Khazhinsky et al. | 361/56 |
| 2006/0203405 A1 | 9/2006 | Bhattacharya et al. | |

FOREIGN PATENT DOCUMENTS

WO  WO2007/007237  1/2007
WO  PCT/US2007/082934  1/2009

* cited by examiner

*Primary Examiner* — Rexford Barnie
*Assistant Examiner* — Zeev V Kitov
(74) *Attorney, Agent, or Firm* — Ryan, Mason & Lewis, LLP

(57) ABSTRACT

An ESD protection circuit includes a first voltage clamp, connected between a first voltage supply node and a second voltage supply node of the circuit, and a second voltage clamp, connected between the second voltage supply node and a voltage return of the circuit. The first voltage supply node is adapted to receive a first voltage which is greater than a prescribed gate oxide reliability potential of the circuit. The second voltage supply node is operative to receive a second voltage which is less than the first voltage. The first voltage clamp is operative to clamp the first voltage on the first voltage supply node to a first value during an ESD event between the first and second voltage supply nodes, and the second voltage clamp is operative to clamp the second voltage on the second voltage supply node to a second value during an ESD event between the second voltage supply node and the voltage return.

20 Claims, 4 Drawing Sheets

ELECTROSTATIC DISCHARGE PROTECTION CIRCUIT

FIELD OF THE INVENTION

The present invention relates generally to electronic circuits, and more particularly relates to electrostatic discharge (ESD) protection circuits.

BACKGROUND OF THE INVENTION

The use of ESD protection circuitry for protecting an integrated circuit (IC) device from damage caused by the discharge of static electricity and/or other transient pulses (e.g., load dump) through the device is well known. An ESD event, which may include any large voltage and/or current transient pulse, may not necessarily cause immediate (i.e., catastrophic) failure of the device, but may damage only a portion of the device and/or cause a latent defect that can significantly shorten the operating life or negatively impact the reliability of the device.

Certain applications, such as, for example, electronic fuse (eFuse) programming, involve the application of a relatively high-energy (e.g., voltage and/or current) signal from a suitable power supply source to an IC. In the case of eFuse programming, a voltage greater than that allowed for a specified gate oxide reliability of an IC is typically applied to one or more pins (e.g., eFuse programming pin) of the IC. The voltage applied to the IC pin is routed through a selected eFuse to be programmed, thereby causing the resistance of the eFuse to change. This programming voltage is only applied to the IC pin for a relatively short period of time and then the pin is tied to ground in a subsequent read operation for verifying the state programmed into the eFuse.

IC pins typically include standard ESD clamping circuits for protecting circuitry coupled to the IC pins from becoming damaged as a result of an ESD event. While the use of standard ESD clamping circuits may be acceptable in many eFuse programming applications when the programming voltage is applied to the IC for a very short period of time (e.g., less than one second), it is often difficult to adhere to this short programming time requirement with any consistency. When a high-energy signal, such as, for example, an eFuse programming signal, is applied to the pin of a packaged IC device, as may be required in a post-packaging eFuse programming operation, circuitry coupled to the IC pin can be damaged, often as a result of a compromised gate oxide in the ESD protection circuit, which is undesirable.

Accordingly, there exists a need for an improved ESD protection circuit suitable for use in a high-voltage environment that does not suffer from one or more of the problems exhibited by conventional ESD protection circuits.

SUMMARY OF THE INVENTION

An illustrative embodiment of the present invention meets the above-noted need by providing an enhanced ESD protection circuit suitable for use in an IC adapted for receiving an applied voltage, such as, but not limited to, an eFuse programming signal, that is greater than that which a gate oxide reliability of the IC will otherwise allow. To accomplish this, an embodiment of the invention utilizes multiple voltage clamp stages applied to an IC pin adapted to receive the applied voltage.

In accordance with an embodiment of the invention, an ESD protection circuit includes a first voltage clamp, connected between a first voltage supply node and a second voltage supply node of the circuit, and a second voltage clamp, connected between the second voltage supply node and a voltage return of the circuit. The first voltage supply node is adapted to receive a first voltage which is greater than a prescribed gate oxide reliability potential of the circuit. The second voltage supply node is operative to receive a second voltage which is less than the first voltage. The first voltage clamp is operative to clamp the first voltage on the first voltage supply node to a first value during an ESD event between the first and second voltage supply nodes, and the second voltage clamp is operative to clamp the second voltage on the second voltage supply node to a second value during an ESD event between the second voltage supply node and the voltage return. One or more ESD protection circuits can be included in an integrated circuit device.

In accordance with another embodiment of the invention, a method for protecting a circuit from an ESD event between a first voltage supply node and a voltage return of the circuit, and/or between a second voltage supply node and the voltage return of the circuit is provided. The first voltage supply node is adapted to receive a first voltage which is greater than a prescribed gate oxide reliability potential of the circuit, and the second voltage supply node is operative to receive a second voltage which is less than the first voltage. The method includes the steps of clamping the first voltage on the first voltage supply node to a first value during the ESD event; and clamping the second voltage on the second voltage supply node to a second value during the ESD event.

These and other features, objects and advantages of the present invention will become apparent from the following detailed description of illustrative embodiments thereof, which is to be read in connection with the accompanying drawings.

DETAILED DESCRIPTION OF THE INVENTION

Figure 1:
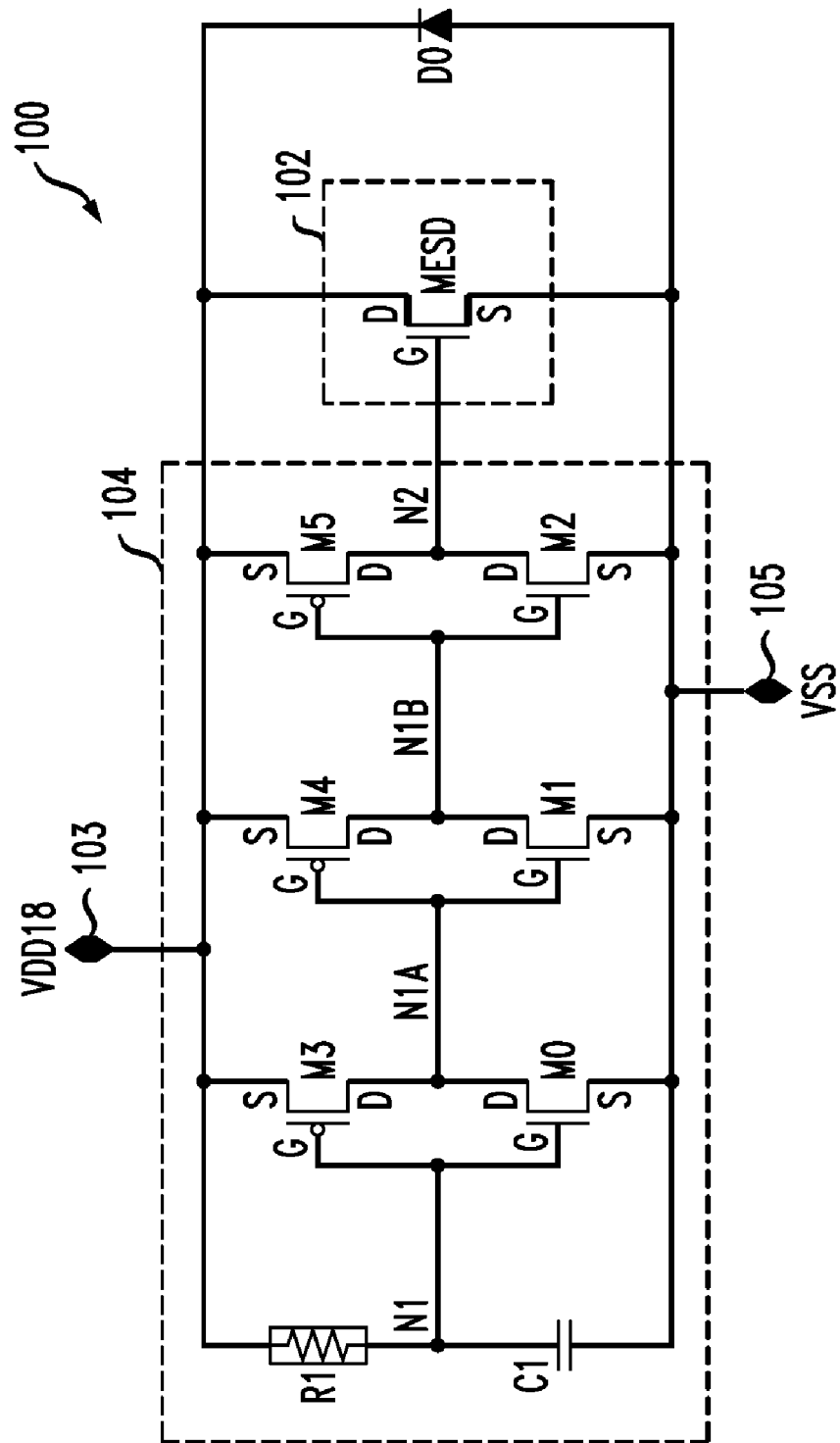
FIG. 1 is a schematic diagram depicting an illustrative ESD protection circuit which may be modified to incorporate techniques of the present invention.

The present invention will be described herein in the context of illustrative ESD protection circuits suitable for use in protecting a circuit, such as an IC, from damage resulting from an ESD event. It should be understood, however, that the present invention is not limited to these or any other particular ESD protection circuit arrangements. Rather, the invention is more generally applicable to techniques for protecting a circuit from an ESD event while still allowing a high-energy signal, for example, a signal generating a voltage greater than a prescribed maximum gate oxide voltage, to be applied to a power pin of an IC without compromising gate oxide reliability in the IC. To accomplish this, the invention utilizes a multiple-stage voltage clamping arrangement, illustrative embodiments of which will be described in further detail below.

The term "power pin" as used herein is intended to refer to a power node of the ESD protection circuit that is preferably accessible externally to the circuit through, for example, IC pads, bond wires, IC package pins, etc. It is to be understood that the power nodes in the ESD protection circuit may or may not be directly bonded out to corresponding package pins associated with an IC device comprising the ESD protection circuit.

During normal operation (e.g., when an ESD event is not present), the ESD protection circuit does not consume any significant direct current (DC) power and is therefore suitable for use in power sensitive applications. Although implementations of the present invention are described herein with specific reference to p-channel metal-oxide-semiconductor (PMOS) and n-channel metal-oxide-semiconductor (NMOS) transistor devices, as may be formed using a complementary metal-oxide-semiconductor (CMOS) fabrication process, it is to be appreciated that the invention is not limited to such transistor devices and/or such a fabrication process, and that other suitable devices, such as, for example, bipolar junction transistors (BJTs), etc., and/or fabrication processes (e.g., bipolar, BiCMOS, etc.), may be similarly employed, as will be understood by those skilled in the art. Moreover, although preferred embodiments of the invention are typically fabricated in a silicon wafer, embodiments of the invention can alternatively be fabricated in wafers comprising other materials, including but not limited to Gallium Arsenide (GaAs), Indium Phosphide (InP), etc.

In principle, an ESD protection circuit is active only during an ESD event and forms a current discharge path for shunting the significantly large ESD current (e.g., on the order of several amperes), as well as clamping the voltage of one or more input/output pads associated with the circuit being protected to a sufficiently low level to prevent the circuit being protected from experiencing irreversible damage. It is to be appreciated that a circuit being protected from the ESD event may comprise a single component, as in the case of a discrete device (e.g., a discrete power transistor), or a plurality of devices which may be coupled together to form a larger circuit. An ESD event may be defined to include large voltage (e.g., on the order of several thousand volts) and/or large current (e.g., on the order of several amperes) transient pulses typically having rise times and/or fall times of less than a few nanoseconds (ns), and not merely events that are electrostatic in nature.

FIG. 1 is a schematic diagram depicting an illustrative ESD protection circuit 100 which may be modified to incorporate techniques of the present invention. ESD protection circuit 100, which may be used to protect circuitry in an IC from damage during an ESD event, includes an ESD protection structure 102 preferably implemented as a relatively large NMOS transistor device, MESD, (e.g., having a channel width on the order of a few thousand micrometers (μm)) which functions primarily as a voltage clamp. A diode, D0, may also be included in ESD protection circuit 100, a cathode of diode D0 being connected to a voltage supply node, VDD18, and an anode of D0 connected to a voltage return of the circuit, which may be a substrate biasing voltage source, VSS. Diode D0 serves as an additional voltage clamping device. The NMOS device MESD includes a drain (D) connected to VDD18, a source (S) connected to VSS, and a gate (G) for receiving a control signal generated at an output of an ESD trigger circuit 104 at node N2. Voltage supply node VDD18 may be connected to a first power pin 103, to which a voltage (e.g., 1.8 volts) may be supplied for powering circuitry in the IC, and the voltage return may be connected to a second power pin 105, which may be grounded (e.g., zero volts).

It is to be appreciated that, because a metal-oxide-semiconductor (MOS) device is symmetrical in nature, and thus bidirectional, the assignment of source and drain designations in the MOS device is essentially arbitrary. Therefore, the source and drain of a given MOS device may be referred to generally as first and second source/drain, respectively, where "source/drain" in this context denotes a source or a drain of the device.

NMOS device MESD is preferably appropriately sized so as to provide a current discharge path for shunting the large ESD current generated by the ESD event as well as to clamp the voltage at the voltage supply node VDD18 to a sufficiently low level so as to prevent the IC from being damaged by the ESD event. The control signal generated by the trigger circuit 104 should insure that NMOS device MESD remains inactive during normal operation of the circuit (e.g., when no ESD event is present), otherwise an electrical path would undesirably be formed between the two power pins 103 and 105 via NMOS device MESD.

Trigger circuit 104 includes a timing circuit, which may be implemented as a resistor-capacitor (RC) circuit comprising a resistor, R1, connected in series with a capacitor, C1, across voltage supply node VDD18. More particularly, a first terminal of resistor R1 is connected to VDD18, a second terminal of R1 is connected to a first terminal of capacitor C1 at node N1, and a second terminal of C1 is connected to VSS. The timing circuit is preferably operative to detect an ESD transition between pins 103 and 105. Once an ESD event has occurred, the amount of time that the ESD protection circuit 100 remains active is controlled primarily by the timing circuit. A time constant, τ, where τ=R1×C1, of the RC timing circuit is set by appropriate selection of a resistance value for R1 and a capacitance value for C1, as will be known by those skilled in the art. The time constant of the RC timing circuit is preferably selected to be in a range from about 0.1 microseconds (μs) to about 100 μs. A time constant on the order of about 1 μs is preferred in that it would allow the ESD protection circuit 100 to remain active substantially beyond the duration of a HBM ESD event, that has an RC duration of about 150 ns (e.g., 1.5 kilo (K) ohms and 100 picofarad (pF)), and yet is substantially less than the duration of a typical voltage supply ramp-up period (e.g., power-up), generally on the order of several milliseconds (ms). In an illustrative embodiment, for example, resistor R1 is selected to be about 550K ohms and capacitor C1 is selected to be about 1.4 pF, resulting in a time constant of about 0.77 μs, although the invention is not limited to any particular time constant value, nor is the invention limited to any particular values for timing components R1 and C1.

The voltage developed by the timing circuit at node N1 is preferably buffered by a series of inverters to generate the control signal at output node N2. Specifically, trigger circuit 104 includes a first inverter comprising a first NMOS transistor device, M0, and a first PMOS transistor device, M3; a second inverter comprising a second NMOS transistor device, M1, and a second PMOS transistor device, M4; and a third inverter comprising a third NMOS transistor device, M2, and a third PMOS transistor device, M5. Sources of NMOS devices M0, M1 and M2 are connected to voltage return VSS, and sources of PMOS devices M3, M4 and M5 are connected to voltage supply node VDD18. Gates of devices M0 and M3 are connected together at node N1 and form an input of the first inverter, and drains of M0 and M3 are connected together and form an output of the first inverter at node N1A. Gates of devices M1 and M4 are connected together at node N1A and form an input of the second inverter, and drains of M1 and M4 are connected together and form an output of the second inverter at node N1B. Gates of devices M2 and M5 are connected together at node N1B and form an input of the third inverter, and drains of M2 and M5 are connected together and form an output of the third inverter at node N2.

One disadvantage of ESD protection circuit 100 is that when a high-energy signal, such as an eFuse programming signal, is applied to pin 103 of the IC device, as may be required in a post-packaging eFuse programming application, circuitry coupled to the IC pin can be damaged, often as a result of a compromised gate oxide in the IC. For example, when a 2.5-volt eFuse programming signal is applied to pin 103 of an IC fabricated using a 1.8-volt gate oxide process for longer than a prescribed period of time (e.g., greater than about one second), a gate oxide of the IC can become damaged, thereby undesirably affecting a reliability of the IC.

Figure 2:
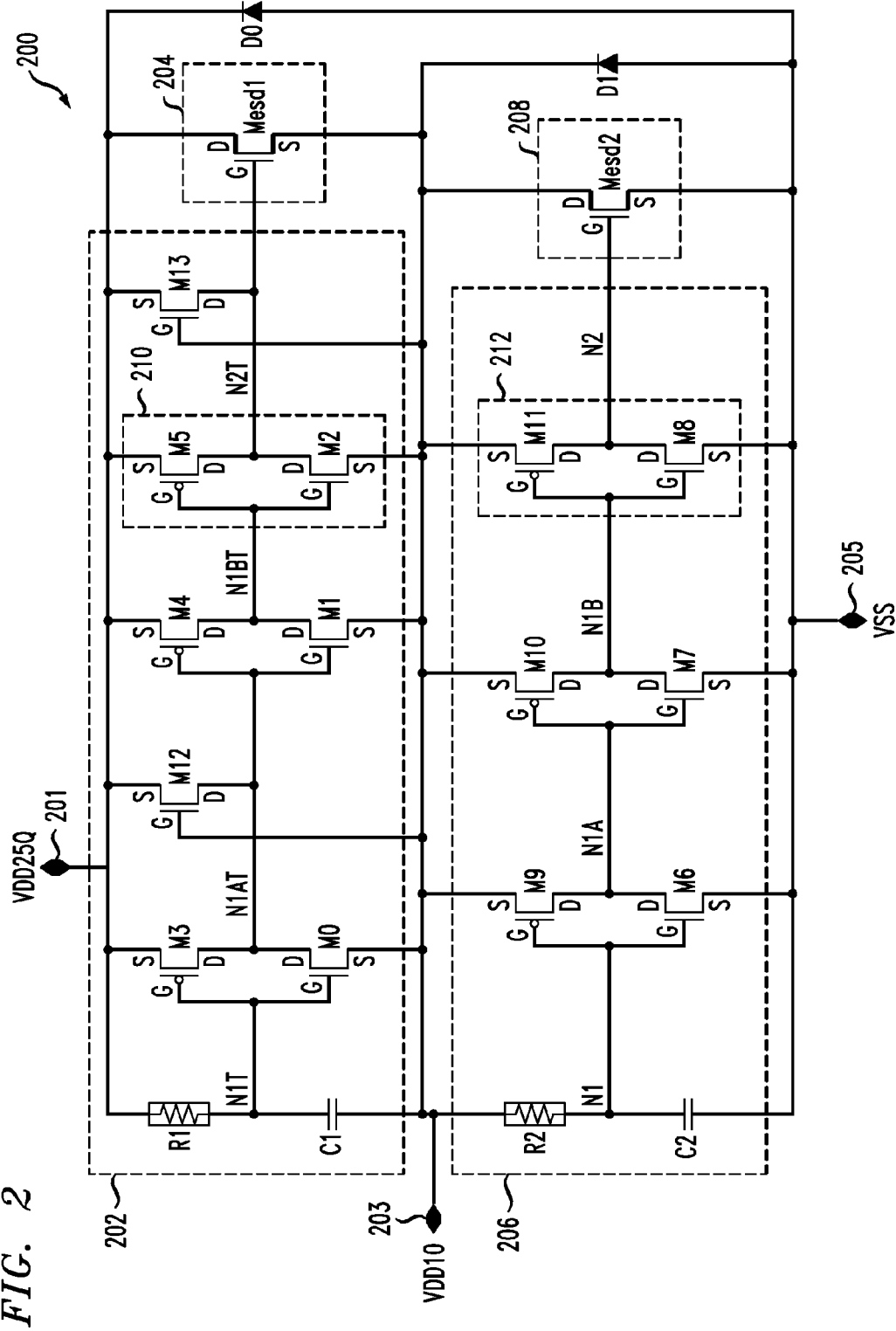
FIG. 2 is a schematic diagram depicting an exemplary ESD protection circuit, formed in accordance with an embodiment of the present invention.

FIG. 2 is a schematic diagram depicting at least a portion of an exemplary ESD protection circuit 200 suitable for use with an applied high-energy signal, in accordance with an embodiment of the present invention. In order to enable ESD protection circuit 200 to be used with an applied voltage which is greater than that which a reliability of the gate oxide of the IC will otherwise allow, the ESD protection circuit utilizes a multiple-stage clamping arrangement. Specifically, ESD protection circuit 200 includes a first voltage clamp comprising a first trigger circuit 202 coupled to a first ESD protection structure 204, and a second voltage clamp comprising a second trigger circuit 206 coupled to a second ESD protection structure 208. One or more PMOS and NMOS transistors in the first voltage clamp are preferably high voltage devices suitable for operation with a higher voltage supply (e.g., about 2.5 volts). One or more PMOS and NMOS transistor in the second voltage clamp are preferably low voltage devices suitable for operation with a lower core voltage supply (e.g., about 1.0 volt).

Modern mixed signal integrated circuit processes typically offer two or more versions of transistors fabricated on the same chip, namely, "high voltage" and "low voltage" transistor devices. The low voltage devices, which typically have a very thin gate oxide (e.g., about 15 to about 25 Angstroms), a very short gate length (e.g., about 0.06 µm to about 0.12 µm), and generally have a nominal threshold voltage of about 0.35 volt, are intended to operate with a lower core supply voltage (e.g., about 1.0 volt). The high voltage devices, which typically have much thicker gate oxides and longer gate lengths compared to low voltage devices, and generally have a nominal threshold voltage which is substantially higher than the low voltage devices, such as, for example, about 0.75 volt, are intended to operate with a higher supply voltage (e.g., about 2.5 volts). High voltage and low voltage transistor versions are generally offered in both NMOS and PMOS device types. An advantage of the low voltage transistors is that they offer good performance when used with a lower core supply and are considerably smaller in area compared to high voltage transistors. However, when a voltage substantially higher than the lower core supply (e.g., 2.5 volts) is applied across any of the terminals of a low voltage transistor, reliability problems or even device failure can occur.

As apparent from FIG. 2, the first voltage clamp is connected between a first voltage supply node, VDD25Q, and a second voltage supply node, VDD10, and the second voltage clamp is connected between the second voltage node VDD10 and a voltage return node of the circuit, which may be substrate biasing source node VSS. First voltage supply node VDD25Q may be connected to a first power pin 201, to which a high-voltage eFuse programming signal (e.g., 2.5 volts), or an alternative voltage source, may be selectively applied. Likewise, second voltage supply node VDD10 may be connected to a second power pin 203, which may be connected to a lower core supply voltage source of the circuit (e.g., 1.0 volt). The voltage return node VSS of ESD protection circuit 200 may be connected to a third power pin 205, which may be coupled to ground (e.g., zero volts). It is to be understood that the invention is not limited to any particular voltage levels applied to the respective power pins 201, 203 and 205.

First ESD protection structure 204, like ESD protection structure 102 in the ESD protection circuit 100 shown in FIG. 1, preferably includes a relatively large NMOS transistor device, Mesd1, (e.g., having a channel width on the order of a few thousand micrometers) having a drain connected to first voltage supply node VDD25Q, a source connected to second voltage supply node VDD10, and a gate for receiving a first control signal generated at an output of the first ESD trigger circuit 202 at node N2T. Likewise, second ESD protection structure 208 preferably includes a relatively large NMOS transistor device, Mesd2, having a drain connected to second voltage supply node VDD10, a source connected to voltage return node VSS, and a gate for receiving a second control signal generated at an output of the second ESD trigger circuit 206 at node N2. In an illustrative embodiment, each of devices Mesd1 and Mesd2 have a channel width (W) of about 3000 µm and a channel length (L) of about 0.2 µm, although the invention is not limited to any particular sizes for devices Mesd1 and Mesd2. Moreover, Mesd1 and Mesd2 need not be of the same size relative to one another.

The first trigger circuit 202 preferably comprises a plurality of inverters, each of the inverters including a PMOS transistor and an NMOS transistor. In particular, a first inverter comprises PMOS transistor M3 and NMOS transistor M0, each transistor having a source, a drain and a gate. The source of M3 is connected to first voltage supply node VDD25Q, the drains of M3 and M0 are connected together to form an output of the first inverter at node N1AT, the gates of M3 and M0 are connected together to form an input of the first inverter at node N1T, and the source of M0 is connected to second voltage supply node VDD10. Likewise, a second inverter comprises PMOS transistor M4 and NMOS transistor M1. A source of M4 is connected to VDD25Q, drains of M4 and M1 are connected together to form an output of the second inverter at node N1BT, gates of M4 and M1 are connected to the output of the first inverter at node N1AT, and a source of M1 is connected to VDD10.

The input of the first inverter in first trigger circuit 202 is preferably coupled to an RC circuit, or alternative timing circuitry, for controlling an amount of time that the first trigger circuit remains active after an ESD event occurs, as will be understood by those skilled in the art. The RC circuit includes a resistor R1, or an alternative resistive element (e.g., MOS device), connected in series with a capacitor C1, or an alternative capacitive element (e.g., MOS device), between first voltage supply node VDD25Q and second voltage supply node VDD10, the junction of R1 and C1 being connected to the input of the first inverter at node N1T. In a preferred embodiment of the invention, a time constant, τ1, where τ1=R1×C1, of the RC circuit is selected to be in a range from about 0.1 µs to about 100 µs, although the invention is not limited to any particular time constant. By way of example only, resistor R1 may be selected to be about 550K ohms and capacitor C1 may be selected to be about 1.4 pF, resulting in a time constant of about 0.77 µs. This time constant is preferred in that it would allow the ESD protection circuit 200 to remain active substantially beyond the duration of a HBM ESD event, that has an RC duration of about 150 ns (e.g., 1.5K ohms and 100 pF), and yet is substantially less than the duration of a typical voltage supply ramp-up period (e.g., power-up), generally on the order of several milliseconds.

The first trigger circuit 202 further includes an output stage 210 having an input coupled to the output of the second inverter at node N1BT and having an output at node N2T for generating the first control signal for controlling transistor Mesd1. Specifically, the output stage 210 is preferably configured as a full CMOS inverter, comprising NMOS transistor M2 and PMOS transistor M5, each transistor including a drain, a source and a gate. The source of M5 is connected to first voltage supply node VDD25Q, the drains of M2 and M5 are connected together at output node N2T, the gates of M2 and M5 are connected to the output of the second inverter at node N1BT, and the source of M2 is connected to the second voltage supply node VDD10. Alternative circuitry is similarly contemplated for output stage 210.

The second trigger circuit 206, like the first trigger circuit 202, preferably comprises a plurality of inverters. A first inverter includes PMOS transistor M9 and NMOS transistor M6, each transistor having a source, a drain and a gate. The source of M6 is connected to voltage return VSS, the drains of M6 and M9 are connected together to form an output of the first inverter at node N1A, the gates of M6 and M9 are connected together to form an input of the first inverter at node N1, and the source of M9 is connected to second voltage supply node VDD10. A second inverter comprises PMOS transistor M10 and NMOS transistor M7. A source of M7 is connected to VSS, drains of M7 and M10 are connected together to form an output of the second inverter at node N1B, gates of M7 and M10 are connected to the output of the first inverter at node N1A, and a source of M10 is connected to VDD10.

The input of the first inverter in second trigger circuit 206 is preferably coupled to an RC circuit, or alternative timing circuitry, which, like the RC circuit in first trigger circuit 202, is operative to control an amount of time that the second trigger circuit remains active after the ESD event occurs. The RC circuit includes a resistor R2, or an alternative resistive element, connected in series with a capacitor C2, or an alternative capacitive element, between second voltage supply node VDD10 and the voltage return VSS, the junction of R2 and C2 being connected to the input of the first inverter at node N1. In a preferred embodiment of the invention, a time constant, τ2, where τ2=R2×C2, of the RC circuit is selected to be in a range from about 0.1 µs to about 100 µs, although the invention is not limited to any particular time constant. By way of example only, R2 may be selected to be about 550K ohms and C2 may be selected to be about 1.4 pF, resulting in a time constant of about 0.77 µs.

The second trigger circuit 206 further includes an output stage 212 having an input coupled to the output of the second inverter at node N1B and having an output at node N2 for generating the second control signal presented to transistor Mesd2. Specifically, the output stage 212, like output stage 210, is preferably configured as a full CMOS inverter, comprising NMOS transistor M8 and PMOS transistor M11, each transistor including a drain, a source and a gate. The source of M8 is connected to VSS, the drains of M8 and M11 are connected together at node N2, the gates of M8 and M11 are connected to the output of the second inverter at node N1B, and the source of M11 is connected to VDD10. Alternative circuitry is similarly contemplated for output stage 212.

It is to be appreciated that while the first and second trigger circuits 202 and 206, respectively, are shown as including three inverters, the trigger circuits are not limited to the particular number of inverters shown. Rather, more inverters (e.g., five) or less inverters (e.g., one) may be employed in the first and/or second trigger circuits. Moreover, first and second trigger circuits 202 and 206 may comprise alternative circuitry for buffering respective timing signals generated by the corresponding timing circuits for generating the first and second control signals. The number of inverters used in a given trigger circuit may be selected so as to optimize a propagation delay in the trigger circuit. An objective of this approach is to drive the large transistors Mesd1, Mesd2, each of which have a significant gate capacitance associated therewith, with a minimum sized inverter. As will be understood by those skilled in the art, the strategy is to increase the size of each successive inverter in the trigger circuit by a factor of approximately 2.7 times the inverter preceding, although alternative optimization schemes are similarly contemplated by the invention. The propagation delay through each inverter will ideally be a constant, approximately equal to about 2.7× $t_d$, where $t_d$ is a delay of a minimum-sized inverter with an equivalent load of another minimum-sized inverter.

ESD protection circuit 200 may further include first and second diodes, D0 and D1, respectively. Diode D0 is connected between the first voltage supply node VDD25Q and the voltage return node VSS. More particularly, a cathode of diode D0 is connected to VDD25Q and an anode of D0 is connected to VSS. Likewise, diode D1 is connected between the second voltage supply node VDD10 and VSS. More particularly, a cathode of diode D1 is connected to VDD10 and an anode of D1 is connected to VSS. The diodes D0 and D1 provide ESD protection when a given one of the power pins 201, 203 is stressed negative with respect to power pin 205 by clamping the potential at the corresponding voltage supply nodes VDD25Q, VDD10.

Diodes D0 and D1 preferably comprise discrete junction (e.g., N+ to P-well) diodes, particularly when a high-resistance p− substrate is used, although one or more of diodes D0 and D1 can be implemented as parasitic diodes as well, especially when a low-resistance p+ substrate is employed. Because diodes D0 and D1 do not have gates, they are not susceptible to gate oxide damage resulting from an applied signal having a potential greater than that which a gate oxide reliability of the IC will otherwise allow. Consequently, diode D0 can be connected directly across the higher voltage supply, between VDD25Q and VSS.

When used, for example, during an eFuse programming mode of operation, a high-energy programming signal (e.g., 2.5 volts) is applied to the first power pin 201 of ESD protection circuit 200. After programming of a selected eFuse has been completed, the high-energy signal is preferably removed and pin 201 is grounded (e.g., zero volts applied) during a read mode of operation to verify that the eFuse has been programmed correctly. When VDD25Q is grounded, devices M0 and M3 in the first inverter will be turned off, and therefore the voltage potential at node N1AT may be undefined.

To avoid the possibility that a leakage current path will develop between the voltage supply nodes VDD10 and VDD25Q (e.g., as a result of noise or some other coupling), a resistive element, which may be implemented, for example, as an NMOS transistor M12, is preferably connected between node N1AT and voltage supply node VDD25Q. Specifically, a source of M12 is connected to VDD25Q, a drain of M12 is connected to node N1AT, and a gate of M12 is connected to voltage supply node VDD10. Thus, when first voltage supply node VDD25Q is grounded (e.g., zero volt) and assuming second voltage supply node VDD10 is at a potential at least equal to an NMOS threshold voltage (e.g., about 0.75 volt or greater), device M12 will be turned on, thereby pulling node N1AT to the potential of VDD25Q, namely, ground. During programming mode, when VDD25Q is at a potential of about 2.5 volts, device M12 will be turned off. It will become apparent to those skilled in the art from the teachings herein that alternative circuitry may be employed for defining the voltage potential at node N1AT when voltage supply node VDD25Q is grounded (e.g., during a programming read mode of operation). For example, a resistor (not shown) having a high resistance value (e.g., about 500K ohms) may be connected between node N1AT and voltage supply node VDD25Q.

Similarly, when VDD25Q is grounded, devices M2 and M5 in output stage 210 will be turned off, and therefore the voltage potential at node N2T may be undefined. To avoid the possibility that device Mesd1 may be turned on and thereby create a leakage current path between the voltage supply nodes VDD10 and VDD25Q, a resistive element, which may be implemented as an NMOS transistor M13, is preferably connected between node N2T and voltage supply node VDD25Q. Specifically, a source of M13 is connected to VDD25Q, a drain of M13 is connected to node N2T, and a gate of M13 is connected to voltage supply node VDD10. When first voltage supply node VDD25Q is grounded (e.g., zero volt) and assuming second voltage supply node VDD10 is at a potential at least equal to an NMOS threshold voltage, device M13 will be turned on, thereby pulling node N2T to the potential of VDD25Q, namely, ground. During programming mode, when VDD25Q is at a potential of about 2.5 volts, device M13 will be turned off. Alternative circuitry may be employed for defining the voltage potential at node N2T when voltage supply node VDD25Q is grounded. For example, a resistor (not shown) having a high resistance value (e.g., about 500K ohms) may be connected between node N2T and voltage supply node VDD25Q.

Figure 3A:
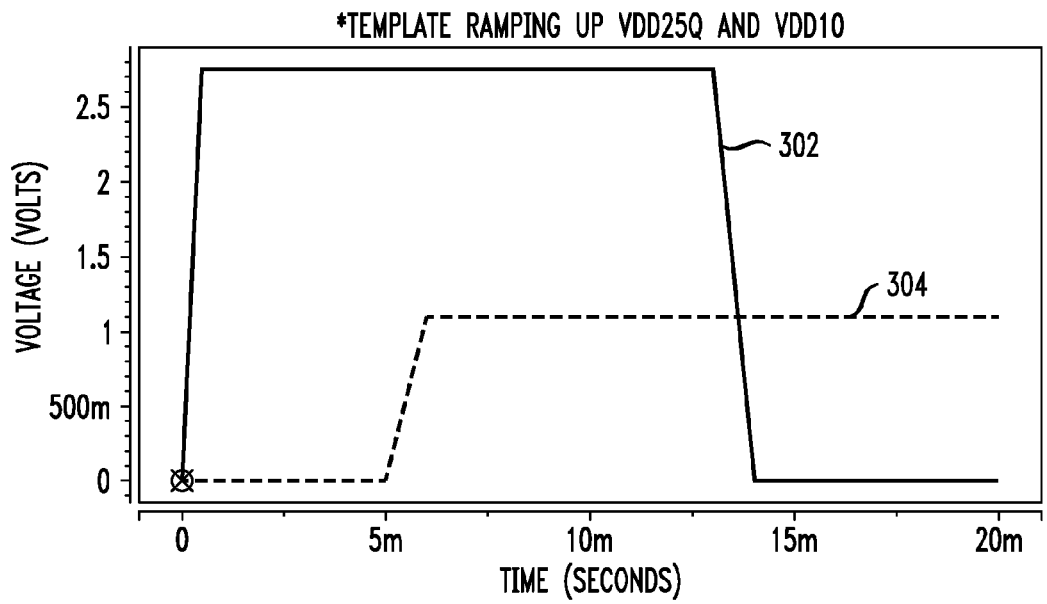
FIGS. 3A and 3B are graphical illustrations depicting an exemplary simulation of the ESD protection circuit shown in FIG. 2 as the voltage potentials applied to corresponding power pins of the circuit are ramped up from zero, in accordance with an aspect of the present invention.
Figure 3B:
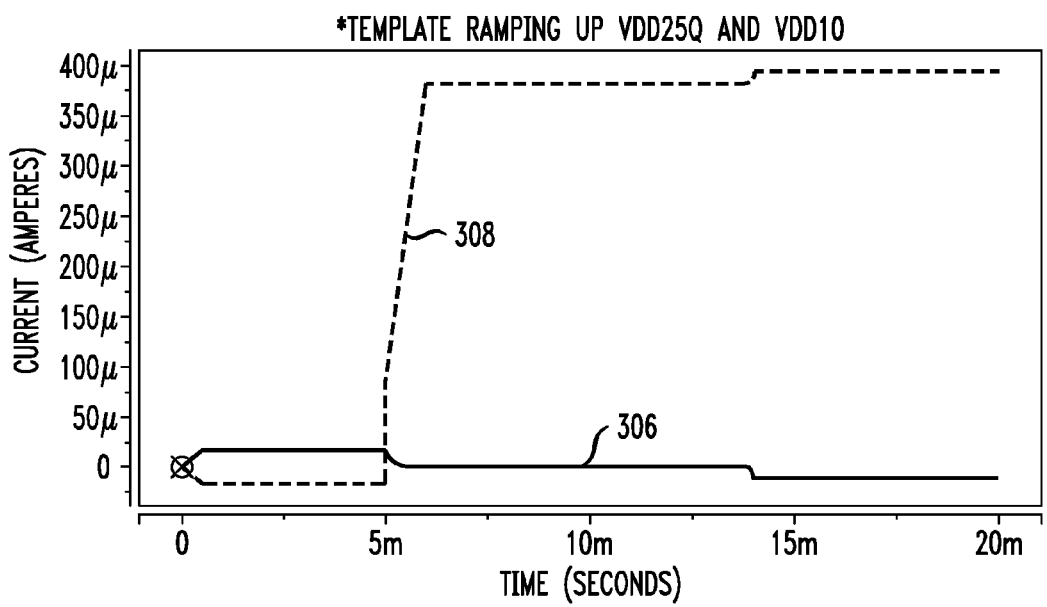
Figure 4:
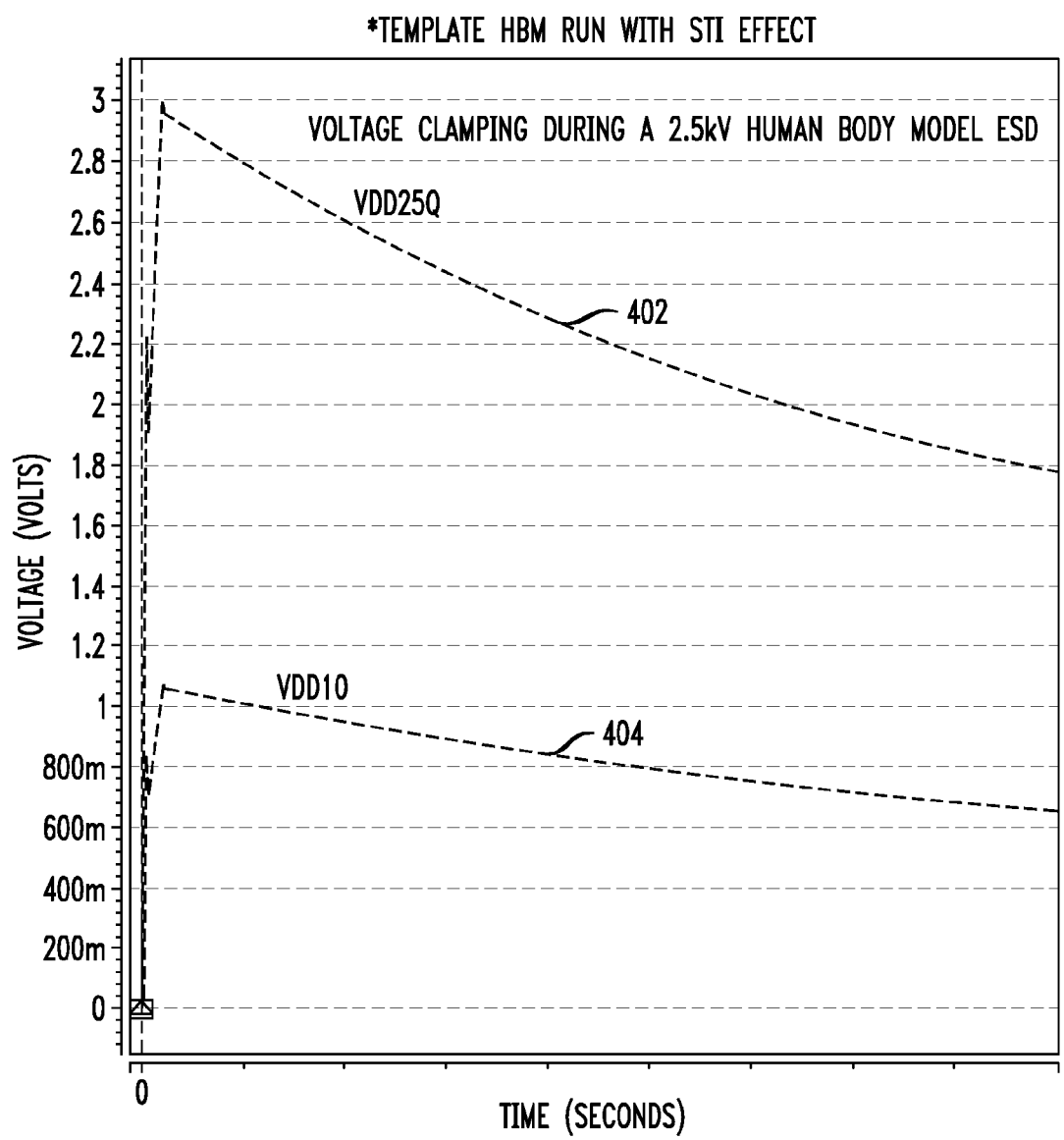
FIG. 4 is a graphical illustration depicting an exemplary simulation of the ESD protection circuit shown in FIG. 2 as a 2.5 kilovolt (kV) Human Body Model (HBM) ESD stress is applied to a power pin of the circuit, in accordance with an aspect of the present invention.

With reference to FIGS. 3A, 3B and 4, an operation of the ESD protection circuit 200 will now be described in further detail. Without loss of generality, during normal programming operation, such as, for example, when there is no ESD event and a programming signal of about 2.5 volts is applied to the first voltage supply node VDD25Q, resistors R1 and R2 pull nodes N1T and N1, respectively, to corresponding voltage supply nodes VDD25Q and VDD10, thereby turning on NMOS transistors M0 and M6 and turning off PMOS transistors M3 and M9. Transistors M0 and M6 being turned on forces nodes N1AT and N1A to a logic low state. In the first voltage clamp, the NMOS devices are all referenced to the second voltage supply node VDD10, and therefore node N1AT will not be at ground potential but will be at the same potential as the second voltage supply (e.g., about 1.0 volt). Nonetheless, this voltage potential (e.g., about 1.0 volt) will be indicative of a logic low level with regard to the first voltage clamp. Nodes N1AT and N1A being a logic low turns on PMOS transistors M4 and M10 and turns off NMOS transistors M1 and M7. Transistors M4 and M10 being turned on forces respective nodes N1BT and N1B to a logic high state (e.g., potentials of nodes VDD25Q and VDD10, respectively). Nodes N1BT and N1B being a logic high turns on NMOS transistors M2 and M8 and turns off PMOS transistors M5 and M11. Transistors M2 and M8 being turned on forces nodes N2T and N2 to a logic low state, thereby turning off the large NMOS transistors Mesd1 and Mesd2.

FIGS. 3A and 3B are graphical illustrations depicting an exemplary simulation of the ESD protection circuit 200 shown in FIG. 2 as the voltage potentials applied to corresponding power pins 201 and 203 are ramped up from zero to voltage potentials 2.75 volts and 1.1 volts, respectively, which is about ten percent above their respective nominal voltages (e.g., 2.5 volts and 1.0 volt). Although the simulation assumes different supply ramp rates for the two voltage supplies, the techniques of the present invention are similarly applicable for essentially any combination of ramp rates. Graph 302 indicates the voltage at node VDD25Q, which is representative of the 2.5-volt programming supply, graph 304 indicates the voltage at node VDD10, which is representative of the 1.0-volt core supply, graph 306 indicates the current dissipation in the 2.5-volt programming supply and graph 308 indicates the current dissipation in the 1.0-volt core supply.

As shown in the exemplary simulation, when both voltage supplies are off (e.g., at time 0), the current dissipation in the 2.5-volt and 1.0-volt supplies is about zero amperes. As the potential at node VDD25Q, ramps up, reaching its maximum voltage of about 2.75 volts at about 0.5 ms, the current dissipation in the 1.0-volt supply decreases to about −20 microamperes (µA) and the current dissipation in the 2.5-volt supply increases by about the same amount to about 20 µA. Current dissipation in the voltage supplies essentially remains at their respective levels until the voltage at node VDD10 begins to ramp up. The potential at node VDD25Q remains at about 2.75 volts until it begins to ramp down at about 13 ms.

At about 5.0 ms, the potential at node VDD10 begins to ramp up. Once the potential at node VDD10 exceeds a MOS threshold voltage (e.g., about 0.35 volt for low voltage devices), current dissipation in the 1.0-volt supply rises to about 80 µA. Current dissipation in the 1.0-volt supply continues to rise substantially linearly to about 380 µA, at which point the potential at node VDD10 is fully ramped up to 1.1 volts at about 6.0 ms. The current dissipation in the 2.5-volt supply drops to about zero as the potential at node VDD10 ramps up to its full 1.1 volts. At about 13 ms, the potential at node VDD25Q begins to ramp down and reaches zero volts at about 14 ms. At this point, current dissipation in the 2.5-volt supply drops to about −10 µA and current dissipation in the 1.0-volt supply increases by about the same amount to about 390 µA. Voltage and current levels remain at these values for the duration of the simulation.

During an ESD event, one or both power pins 201, 203 of the ESD protection circuit 200 may be stressed relative to one another or to pin 205. By way of example only, assume that power pins 201 and 203 are at ground potential (e.g., zero volts). When pin 201 is stressed with respect to pin 203, the first trigger circuit 202 will provide the first control signal at node N2T for activating transistor Mesd1. Specifically, when the voltage potential on first voltage supply node VDD25Q is stressed above the second voltage supply node VDD10 (e.g., 2.5 kV HBM), capacitor C1 will at least initially hold node N1T at the potential of VDD10 (e.g., about 1.0 volt). Once node VDD25Q rises about a threshold voltage above node VDD10, transistor M3 will turn on. Transistor M3 being turned on forces node N1AT to a high logic state, thereby turning on transistor M1 and turning off transistor M4. Transistor M1 being turned on forces node N1BT low, thereby turning on transistor M5 and turning off transistor M2. Transistor M5 being turned on pulls node N2T, and thus the gate of transistor Mesd1, high, thereby turning on Mesd1 and clamping the voltage on VDD25Q to a desired value.

Similarly, assuming power pin 203, and thus node VDD10, is at ground potential, when VDD10 is stressed with respect to power pin 205, the second trigger circuit 206 will provide the second control signal at node N2 for activating transistor Mesd2. Specifically, when the voltage potential on the second voltage supply node VDD10 is stressed above voltage return node VSS (e.g., 2.5 kV HBM), capacitor C2 will at least initially hold node N1 at ground potential. Once VDD10 rises about a threshold voltage above ground, transistor M9 will turn on. Transistor M9 being turned on forces node N1A to a high logic state, thereby turning on transistor M7 and turning off transistor M10. Transistor M7 being turned on forces node N1B low, thereby turning on transistor M11 and turning off transistor M8. Transistor M11 being turned on pulls node N2, and thus the gate of transistor Mesd2, high, thereby turning on Mesd2 and clamping the voltage on VDD10.

When the voltage supply nodes VDD25Q and/or VDD10 are stressed negative with respect to voltage return node VSS, diodes D0 and/or D1, respectively, will help clamp the respective voltages to a desired potential. Accordingly, diodes D0 and D1 are to be sized appropriately to handle the expected ESD current, as will be understood by those skilled in the art.

FIG. 4 is a graphical illustration depicting an exemplary simulation of the ESD protection circuit 200 shown in FIG. 2 as a 2.5 kV HBM ESD stress is applied to power pin 201. Graph 402 represents the voltage at first voltage supply node VDD25Q and graph 404 represents the voltage at second voltage supply node VDD10. As apparent from the figure, the ESD protection circuit 200 successfully clamps the voltage at VDD25Q to a maximum of about 2.98 volts and clamps the voltage at VDD10 to a maximum of about 1.06 volts.

At least a portion of the ESD protection circuit of the present invention may be implemented in an IC. In forming ICs, identical die are typically fabricated in a repeated pattern on a surface of a semiconductor wafer. Each die includes a device described herein, and may include other structures and/or circuits. The individual die are cut or diced from the wafer, then packaged as an IC. One skilled in the art would know how to dice wafers and package die to produce ICs. ICs so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. An electrostatic discharge (ESD) protection circuit, comprising:
    a first voltage clamp connected between a first voltage supply node and a second voltage supply node of the circuit, the first voltage supply node being adapted to receive a first voltage which is greater than a prescribed gate oxide reliability potential of the circuit, the second voltage supply node being operative to receive a second voltage which is less than the first voltage; and
    a second voltage clamp connected between the second voltage supply node and a voltage return of the circuit;
    wherein the first voltage clamp is operative independently of the second voltage clamp to clamp the first voltage on the first voltage supply node to a first value during an ESD event between the first and second voltage supply nodes, and the second voltage clamp is operative independently of the first voltage clamp to clamp the second voltage on the second voltage supply node to a second value during an ESD event between the second voltage supply node and the voltage return.

2. The ESD protection circuit of claim 1, wherein the first voltage clamp comprises:
    a trigger circuit operative to detect the ESD event between the first and second voltage supply nodes and to generate a first control signal indicative of the ESD event; and
    an ESD protection structure connected to the trigger circuit, the ESD protection structure being operative to form a current discharge path between the first and second voltage supply nodes in response to the first control signal.

3. The ESD protection circuit of claim 2, wherein the trigger circuit comprises a timing circuit operative to detect an ESD transition between the first and second voltage supply nodes and to control an amount of time the ESD protection circuit remains active after detecting the ESD transition.

4. The ESD protection circuit of claim 3, wherein the timing circuit comprises a resistor-capacitor (RC) circuit including a resistive element and a capacitive element connected together in series between the first and second voltage supply nodes, the amount of time the ESD protection circuit remains active after detecting the ESD transition being a function of values of the resistive and capacitive elements.

5. The ESD protection circuit of claim 3, wherein the trigger circuit further comprises:
    at least a first inverter having an input connected to the timing circuit; and
    an output stage having an input connected to an output of the first inverter and an output for generating the first control signal.

6. The ESD protection circuit of claim 5, wherein the output stage comprises an inverter, a ratio of a size of the inverter in the output stage to a size of the first inverter being selected so as to reduce a propagation delay in the first trigger circuit.

7. The ESD protection circuit of claim 5, wherein the trigger circuit further comprises a resistive element connected between an output of the first inverter and one of the first voltage supply node and the voltage return, the resistive element being operative to set a potential at the input of the output stage to a prescribed voltage when the potential at the first voltage supply node is zero.

8. The ESD protection circuit of claim 5, wherein the trigger circuit further comprises an NMOS transistor device having a first source/drain connected to the first voltage supply node, a second source/drain connected to the output of the first inverter, and a gate connected to the second voltage supply node.

9. The ESD protection circuit of claim 2, wherein the ESD protection structure comprises an NMOS transistor device having a first source/drain connected to the first voltage supply node, a second source/drain connected to the second voltage supply node, and a gate for receiving the first control signal.

10. The ESD protection circuit of claim 1, further comprising:
    a first diode having a cathode connected to the first voltage supply node and an anode connected to the voltage return of the circuit; and
    a second diode having a cathode connected to the second voltage supply node and an anode connected to the voltage return of the circuit.

11. The ESD protection circuit of claim 1, wherein the first voltage clamp comprises at least one metal-oxide semiconductor (MOS) transistor device having a first threshold voltage associated therewith, and the second voltage clamp comprises at least one MOS transistor device having a second threshold voltage associated therewith, the first threshold voltage being greater than the second threshold voltage.

12. The ESD protection circuit of claim 1, wherein the second voltage clamp comprises:
  a trigger circuit operative to detect the ESD event between the second voltage supply node and the voltage return and to generate a second control signal in response thereto; and
  an ESD protection structure connected to the trigger circuit, the ESD protection structure being operative to form a current discharge path between the second voltage supply node and the voltage return in response to the second control signal.

13. The ESD protection circuit of claim 12, wherein the trigger circuit comprises a timing circuit operative to detect an ESD transition between the second voltage supply node and the voltage return and to control an amount of time the ESD protection circuit remains active after detecting the ESD transition.

14. The ESD protection circuit of claim 12, wherein the trigger circuit further comprises:
  at least a first inverter having an input connected to the timing circuit; and
  an output stage having an input connected to an output of the first inverter and an output for generating the second control signal.

15. The ESD protection circuit of claim 14, wherein the trigger circuit further comprises a resistive element connected between an output of the first inverter and one of the first voltage supply node and the voltage return, the resistive element being operative to set a potential at the input of the output stage to a prescribed voltage when the potential at the first voltage supply node is zero.

16. The ESD protection circuit of claim 12, wherein the ESD protection structure comprises an NMOS transistor device having a first source/drain connected to the second voltage supply node, a second source/drain connected to the voltage return, and a gate for receiving the second control signal.

17. A method for protecting a circuit from electrostatic discharge (ESD), the circuit comprising a first voltage supply node, a second voltage supply node and a voltage return, the first voltage supply node being adapted to receive a first voltage which is greater than a prescribed gate oxide reliability potential of the circuit, the second voltage supply node being operative to receive a second voltage which is less than the first voltage, the method comprising the steps of:
  clamping the first voltage on the first voltage supply node to a first value during an ESD event between the first and second voltage supply nodes; and
  clamping the second voltage on the second voltage supply node to a second value during an ESD event between the second voltage supply node and the voltage return;
  wherein the clamping of the first voltage is independent of the clamping of the second voltage.

18. The method of claim 17, further comprising the steps of:
  detecting the ESD event between the first and second voltage supply nodes;
  generating a control signal indicative of the ESD event between the first and second voltage supply nodes; and
  forming a current discharge path between the first and second voltage supply nodes in response to the control signal.

19. The method of claim 17, further comprising the steps of:
  detecting the ESD event between the second voltage supply node and the voltage return;
  generating a control signal indicative of the ESD event between the second voltage supply node and the voltage return; and
  forming a current discharge path between the second voltage supply node and the voltage return in response to the control signal.

20. An integrated circuit including at least one electrostatic discharge (ESD) protection circuit, the at least one ESD protection circuit comprising:
  a first voltage clamp connected between a first voltage supply node and a second voltage supply node of the circuit, the first voltage supply node being adapted to receive a first voltage which is greater than a prescribed gate oxide reliability potential of the circuit, the second voltage supply node being operative to receive a second voltage which is less than the first voltage; and
  a second voltage clamp connected between the second voltage supply node and a voltage return of the circuit;
  wherein the first voltage clamp is operative independently of the second voltage clamp to clamp the first voltage on the first voltage supply node to a first value during an ESD event between the first and second voltage supply nodes, and the second voltage clamp is operative independently of the first voltage clamp to clamp the second voltage on the second voltage supply node to a second value during an ESD event between the second voltage supply node and the voltage return.

* * * * *